(12) United States Patent
Abe (10) Patent No.: US 8,777,499 B2
(45) Date of Patent: Jul. 15, 2014

(54) METHOD FOR MANUFACTURING CAMERA MODULE AND CAMERA MODULE

(75) Inventor: Junichi Abe, Iwate-ken (JP)

(73) Assignee: Kabushiki Kaisha Toshiba, Tokyo (JP)

(*) Notice: Subject to any disclaimer, the term of this patent is extended or adjusted under 35 U.S.C. 154(b) by 280 days.

(21) Appl. No.: 13/339,601

(22) Filed: Dec. 29, 2011

(65) Prior Publication Data
US 2012/0230669 A1 Sep. 13, 2012

(30) Foreign Application Priority Data
Mar. 10, 2011 (JP) ................. 2011-053039

(51) Int. Cl.
*G03B 17/00* (2006.01)
*G03B 17/02* (2006.01)
*H01L 27/146* (2006.01)
*H04N 5/225* (2006.01)

(52) U.S. Cl.
CPC .......... *G03B 17/02* (2013.01); *H01L 27/14685* (2013.01); *H04N 5/2257* (2013.01); *H01L 27/14623* (2013.01); *H01L 27/14683* (2013.01); *H01L 27/14618* (2013.01); *H01L 27/14625* (2013.01)
USPC ........................................................ 396/529

(58) Field of Classification Search
CPC ........ G03B 17/04; G03B 17/12; G03B 17/14; H04N 5/2252; H04N 5/2253; H04N 5/2257
See application file for complete search history.

(56) References Cited

U.S. PATENT DOCUMENTS

| 7,702,226 B1* | 4/2010 | Gutierrez .................... 396/25 |
| 2008/0265436 A1* | 10/2008 | Kawabata et al. ........... 257/778 |
| 2008/0316623 A1* | 12/2008 | Aoki et al. ................... 359/823 |
| 2009/0008683 A1* | 1/2009 | Nishizawa .................. 257/292 |
| 2009/0223711 A1* | 9/2009 | Ueno et al. .................. 174/377 |
| 2010/0117176 A1 | 5/2010 | Uekawa |
| 2011/0285890 A1* | 11/2011 | Choi et al. ................... 348/308 |

FOREIGN PATENT DOCUMENTS

JP 2010-118397 5/2010

* cited by examiner

*Primary Examiner* — Clayton E LaBalle
*Assistant Examiner* — Dennis Hancock
(74) *Attorney, Agent, or Firm* — Oblon, Spivak, McClelland, Maier & Neustadt, L.L.P.

(57) ABSTRACT

Certain embodiments provide methods for manufacturing camera module including arranging a camera module body in a first shield and forming a resin having a light shielding effect. The camera module body has: a sensor board which has a sensor unit; and an optical element which has a lens unit and a spacer. The process of arranging this camera module body in the first shield is a process of arranging the camera module body in the first shield such that a gap is formed between the camera module body and the first shield. The process of forming the resin having the light shielding effect is a process of forming the resin having the light shielding effect in the gap between the first shield and camera module body.

21 Claims, 8 Drawing Sheets

METHOD FOR MANUFACTURING CAMERA MODULE AND CAMERA MODULE

CROSS REFERENCE TO RELATED APPLICATIONS

This application is based upon and claims the benefit of priority from the prior Japanese Patent Application No. 2011-053039 filed in Japan on Mar. 10, 2011; the entire contents of which are incorporated herein by reference.

FIELD

Embodiments described herein relate generally to method for manufacturing camera module and camera module.

BACKGROUND

Conventionally, a camera module is known in which a WLO (Wafer Level Optics) in which a lens body and spacer are integrated element is mounted as an optical on a solid imaging apparatus having a sensor unit. A plurality of WLOs are collectively formed in one wafer, and, consequently, can be manufactured at low cost.

However, the spacer of the WLO is made thinner following miniaturization of the camera module, and therefore there is a problem that the mechanical strength of the spacer is insufficient. Further, the WLO does not usually have the light shielding effect. Hence, it is necessary to additionally form a lens holder having the light shielding effect and mount the WLO in the formed lens holder in order to prevent light from entering the inside of the camera module from, for example, the side surfaces of the camera module and reinforce the mechanical strength of the WLO.

It is desired to reduce manufacturing cost of the conventional camera module having this WLO for lower cost.

DETAILED DESCRIPTION

The method for manufacturing the camera module according to an embodiment includes a process of arranging a camera module body in a first shield, and a process of forming a resin having the light shielding effect. The camera module body has: a sensor board which has a sensor unit; and an optical element which has a lens unit and a spacer. The process of arranging this camera module body in a first shield is a process of arranging the camera module body in the first shield such that a gap is formed between the camera module body and the first shield. The process of forming the resin having the light shielding effect is a process of forming the resin having the light shielding effect, in the gap between the first shield and camera module body.

The camera module according to one embodiment has a camera module body, a first shield and a resin having the light shielding effect. The camera module body has a sensor board which has a sensor unit, and an optical element which is set on this sensor board and which has a lens unit and a spacer. The first shield is arranged such that a gap is formed between the first shield and camera module body. The resin having the light shielding effect is formed in the gap between the first shield and camera module body.

Hereinafter, a camera module manufacturing method and a camera module according to an embodiment will be described with reference to the drawings.

(First Embodiment)

Figure 1:
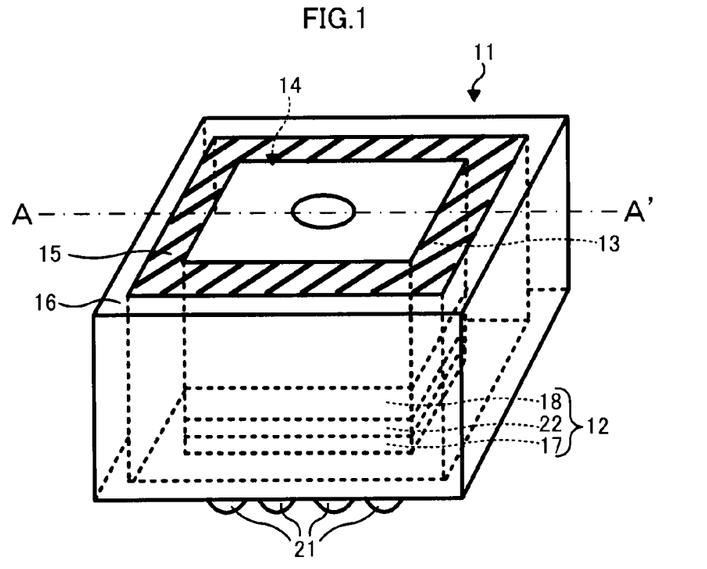
FIG. 1 is a perspective view schematically illustrating a camera module according to a first embodiment.

FIG. 1 is a perspective view schematically illustrating a camera module according to a first embodiment. As illustrated in FIG. 1, with a camera module 11 according to the present embodiment, a camera module body 14 is surrounded by a light shielding resin 15 and a first shield 16 for shielding electromagnetic waves. The camera module body 14 has a solid-state imaging apparatus 12 and a WLO 13 (Wafer Level Optics) in which a lens body and spacer are integrated.

Figure 2:
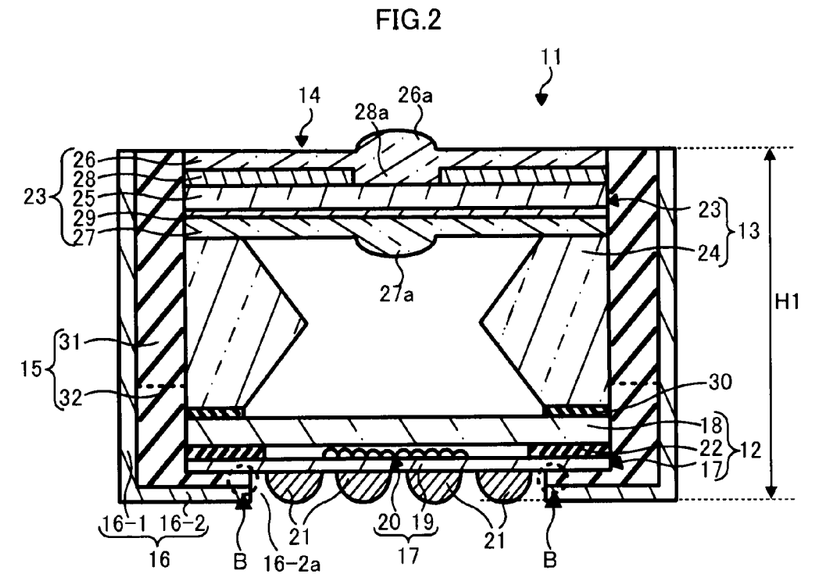
FIG. 2 is a sectional view of a camera module along a dashed-dotted line A-A' in FIG. 1.

FIG. 2 is a sectional view of the camera module along a dashed-dotted line A-A' in FIG. 1. As illustrated in FIG. 2, the solid-state imaging apparatus 12 has a sensor board 17, and a support board 18 which is set and fixed on the sensor board 17.

The sensor board 17 has a silicon board 19 and a sensor unit 20. The sensor unit 20 is formed in the nearly center of the silicon board 19 having, for example, the nearly square horizontal cross-sectional face. Although not illustrated, for example, a plurality of photodiodes are aligned in the sensor unit 20 in a grid shape. Meanwhile, the horizontal cross-sectional face refers to a cross-sectional face parallel to the top surface of the silicon board 19.

In the back surface of the sensor board 17, a plurality of external electrodes 21 are formed. These external electrodes 21 are, for example, solder balls, and are electrically connected to the sensor unit 20. Although not illustrated, the external electrodes 21 are connected to the sensor unit 20 through, for example, a back surface wiring formed in the back surface of the silicon board 19, a penetration electrode which is connected with this back surface wiring and which penetrates the silicon board 19, and a top surface wiring which is formed on the silicon board 19 and which is connected to the penetration electrode.

The support board 18 is an optically transparent board such as a glass board. The horizontal cross-sectional face of the support board 18 has almost the same shape as the sensor board 17. This support board 18 is set and fixed on the sensor board 17 through a first bonding adhesive 22. The first bonding adhesive 22 is formed on the sensor board 17 to surround the sensor unit 20. In addition, these support board 18 and first bonding adhesive 22 seal the sensor unit 20.

The WLO 13 is a cube-shaped optical element, and is formed by integrating the lens body 23 and spacer 24. The lens body 23 has a lens board 25, a first lens layer 26 formed on the top surface of the lens board 25, and a second lens layer 27 formed on the back surface of the lens board 25.

The lens board 25 is a board such as the glass board having the optical transparency, and the horizontal cross-sectional face of the lens board 25 has almost the same shape as the sensor board 17 and support board 18.

The first lens layer 26 is an optically transparent resin layer, and has in substantially the center a lens unit 26*a* which projects in a hemispherical shape. The first lens layer 26 is formed on the top surface of the lens board 25 through a light shielding film 28 formed on the top surface of the lens board 25.

The light shielding film 28 is formed with a film such as a chromium film having the light shielding effect, and has an opening portion 28*a* at a portion directly below the lens unit 26*a*.

The second lens layer 27 is a light shielding resin layer, and has, in the nearly center, a lens unit 27*a* projecting below in a hemispherical shape. The second lens layer 27 is formed on the back surface of the lens board 25 through an infrared-ray shielding filter film 29 formed in the back surface of the lens board 25.

Further, the spacer 24 has a cylindrical shape, and is made of, for example, an optically transparent material such as glass. The upper end of the cylindrical shape of the spacer 24 is fixed to the back surface (second lens layer 27) of the lens body 23. The spacer 24 has the height which matches the focus of the lens body 23 with the sensor unit 20 of the solid-state imaging apparatus 12. The horizontal cross-sectional shape of the spacer 24 is a frame shape formed with an outer peripheral surface having almost the same square shape as the sensor board 17 and an inner peripheral surface of a nearly circular shape. In addition, the diameter of the inner peripheral surface continuously changes in the height direction, and the upper end and lower end of the cylindrical shape are the longest and the center portions of the upper end and lower end are the shortest.

The above-described WLO 13 is set and fixed on the top surface of the solid-state imaging apparatus 12. The WLO 13 is set and fixed on the top surface of the solid-state imaging apparatus 12 by means of a second bonding adhesive 30 formed between the lower end of the spacer 24 and the top surface of the solid-state imaging apparatus 12. In addition, the position of the lens body 23 in the longitudinal direction is adjusted to a nearly desired position by the height of the spacer 24, and is finely adjusted by the thickness of the second bonding adhesive 30.

The solid-state imaging apparatus 12 on which the WLO 13 is mounted, that is, the camera module body 14, is surrounded by the first shield 16 for shielding electromagnetic waves through the light shielding resin 15 described below. The first shield 16 is made of metal having the shape of a cylinder with a closed bottom which has a cylindrical portion 16-1 and a bottom portion 16-2. The first shield 16 has the height substantially matching a first height H1 (a distance H1 between the top surface of the first lens layer 26 except the lens unit 26*a* and the lower end of the external electrode 21) of the camera module body 14.

The first shield 16 is arranged spaced apart from the camera module body 14. That is, the cylindrical portion 16-1 of the first shield 16 surrounds the surrounding of the camera module body 14 to be separated from the side surfaces of the camera module body 14. Further, the bottom portion 16-2 of the first shield 16 is separated from the back surface of the solid-state imaging apparatus 12 (the back surface of the silicon board 19) in the longitudinal direction.

The bottom portion 16-2 of the first shield 16 has the opening portion 16-2*a*. The first shield 16 is arranged such that the external electrodes 21 of the solid-state imaging apparatus 12 are exposed from the opening portion 16-2*a*.

By grounding the external electrodes 21, the first shield 16 can shield electromagnetic waves. The first shield 16 is grounded by, for example, being connected to a grounding wiring formed on a mounting board (not illustrated) on which the camera module 11 is mounted.

The light shielding resin 15 is filled in the gap between the camera module body 14 and first shield 16 to fill the interior of the first shield 16. The light shielding resin 15 is made of a resin which is made black by, for example, being added a black pigment such as carbon black. The light shielding resin 15 prevents light radiated from the outside from being incident on the inside from the side surfaces and bottom surface of the camera module body 14, and functions as a bonding adhesive which bonds the camera module body 14 and first shield 16. In addition, the light shielding resin 15 may not be black, and only needs to have the light shielding effect.

The light shielding shield resin 15 is formed with an upper layer resin 31 and a lower layer resin 32. The lower layer resin 32 is made of an ultraviolet curable resin which is instantaneously cured by being radiated by ultraviolet rays. The lower layer resin 32 is formed to completely fill the gap between the back surface of the solid-state imaging apparatus 12 and bottom portion 16-2 of the first shield 16, and fill to a desired height the gap between the side surfaces of the camera module body 14 and cylindrical portion 16-1 of the first shield 16. In addition, the lower layer resin 32 only needs to be formed to fill at least a gap between the vicinity of the opening portion 16-2*a* (B in FIG. 2) of the bottom portion 16-2 of the first shield 16 and the back surface of the solid-state imaging apparatus 12. The reason therefor will be described later.

The upper resin 31 is made of a thermosetting resin which is heated and thereby cured. The upper layer resin 31 is formed to completely fill the gap which is not filled with the lower resin 32 among the gap between the side surfaces of the camera module body 14 and cylindrical portion 16-1 of the first shield 16.

Next, a method for manufacturing the above-described camera module 11 according to the first embodiment will be described. According to the method for manufacturing the camera module 11 according to the present embodiment, first, a plurality of camera module bodies 14 are formed on one wafer at one time. Next, a plurality of camera module bodies 14 are singulated. Next, the first shield 16 is arranged on each singulated camera module body 14. Finally, the light shielding resin 15 is formed. In addition, as to the method for manufacturing the camera modules according to the subsequent embodiments, all processes up to formation of camera module bodies are the same.

This manufacturing method will be described in detail with reference to FIGS. 3 to 9 below. FIGS. 3 to 9 are sectional views corresponding to FIG. 2 for describing the method for manufacturing the camera module 11 according to the present embodiment.

Figure 3:
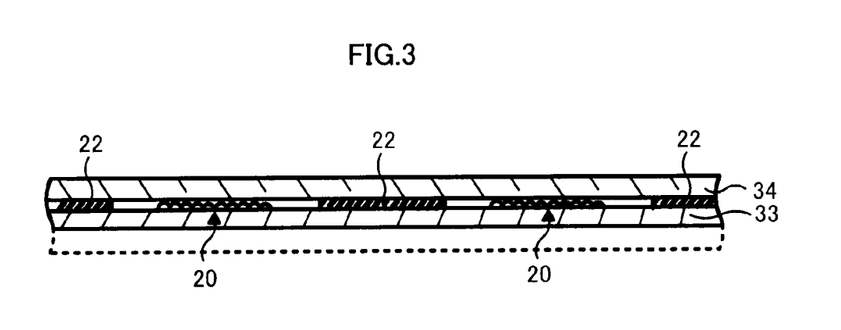
FIG. 3 is a sectional view for describing a process of forming a camera module body in a method for manufacturing the camera module according to the first embodiment.

First, a plurality of sensor units 20 and top surface wirings (not illustrated) are formed in a grid shape on a silicon wafer 33. Subsequently, on the top surface of the silicon wafer 33, the first bonding adhesive 22 is formed to surround the sensor units 20, respectively. After the first bonding adhesive 22 is formed, a glass wafer 34 is set and fixed on the silicon wafer 33 across the first bonding adhesive 22. Then, as illustrated in FIG. 3, the silicon wafer 33 fixed to the glass wafer 34 is made thinner. The silicon wafer 33 is made thinner by polishing the back surface of the silicon wafer 33 according to, for example, a CMP (Chemical Mechanical Polishing) method.

Figure 7:
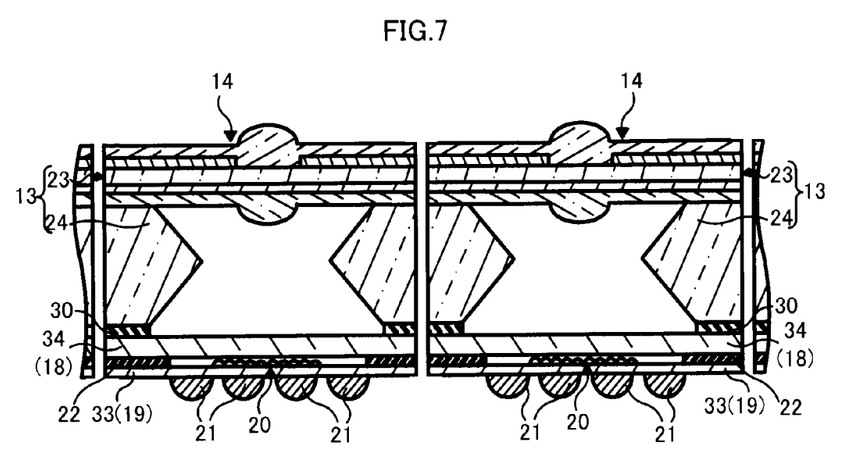
FIG. 7 is a sectional view for describing a process of forming the camera module body in the method for manufacturing the camera module according to the first embodiment.

In addition, the silicon wafer 33 which is made thinner is singulated per camera module body 14 in the process illustrated in subsequent FIG. 7, to provide the silicon board 19, and the glass wafer 34 is singulated per camera module body 14 to provide the support board 18.

Figure 4:
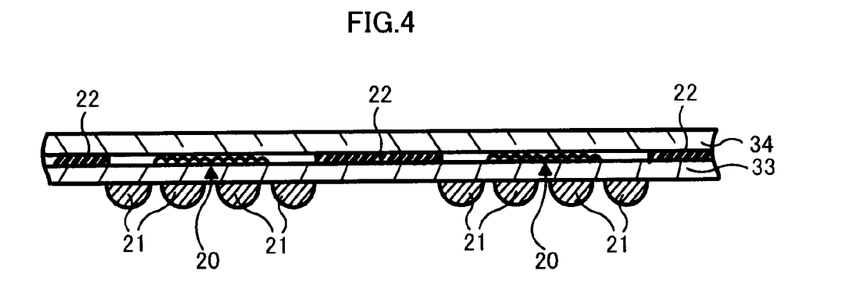
FIG. 4 is a sectional view for describing a process of forming the camera module body in the method for manufacturing the camera module according to the first embodiment.

Next, as illustrated in FIG. 4, a plurality of external electrodes 21 are formed in the back surface of the silicon wafer 33 which is made thinner such that a plurality of external electrodes 21 are electrically connected to the sensor units 20. That is, through-holes (not illustrated) are first formed in the silicon wafer 33 which is made thinner. Next, penetration electrodes are formed in the side surfaces of the through-holes to be connected with the top surface wiring. Next, in the back surface of the silicon wafer 33, the back surface wiring (not illustrated) connected to the penetration electrode is formed. A plurality of external electrodes 21 are formed in contact with this back surface wiring. In addition, a plurality of external electrodes 21 are formed to have a thickness greater than the bottom portion 16-2 (FIG. 2) of the first shield 16.

Figure 5:
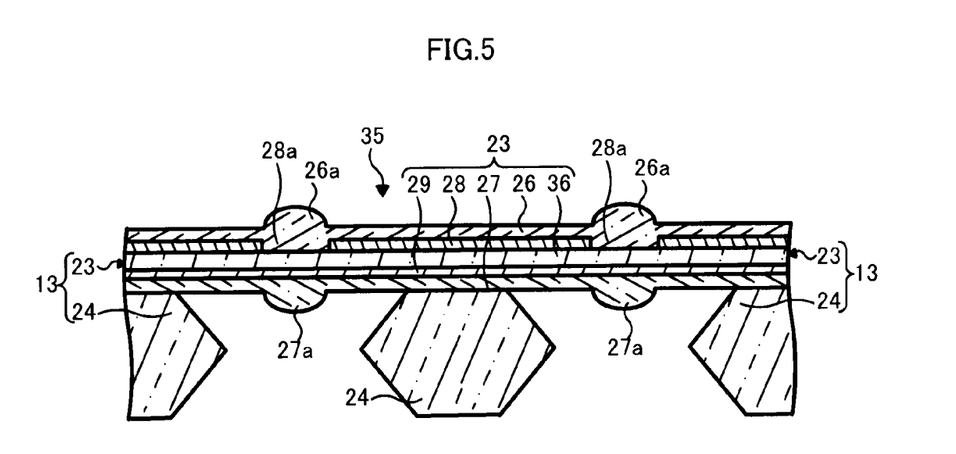
FIG. 5 is a sectional view for describing a process of forming a camera module body in the method for manufacturing the camera module according to the first embodiment.

Further, apart from processes illustrated in FIGS. 3 and 4, as illustrated in FIG. 5, a WLO aggregate 35 formed with a plurality of WLOs 13 are formed as an optical element aggregate formed with a plurality of optical elements. That is, in the top surface of the glass wafer 36, the light shielding film 28 in which the opening portions 28a are formed in a grid shape and the first lens layer 26 which has the lens unit 26a in the grid shape are formed, and, in the back surface of the glass wafer 36, the infrared-ray shielding filter film 29 and the second lens layer 27 which has the lens units 27a in the grid shape are formed. By this means, a plurality of lens bodies 23 are formed in one glass wafer 36. Further, a plurality of spacers 24 are fixed to the back surfaces of a plurality of lens bodies 23. By this means, the WLO aggregate 35 is formed.

In addition, a plurality of spacers 24 are formed as follows. The glass wafer is prepared, and the opening portions are provided in this glass wafer in the grid shape according to a method such as sandblast. By this means, a plurality of spacers 24 are formed.

Figure 6:
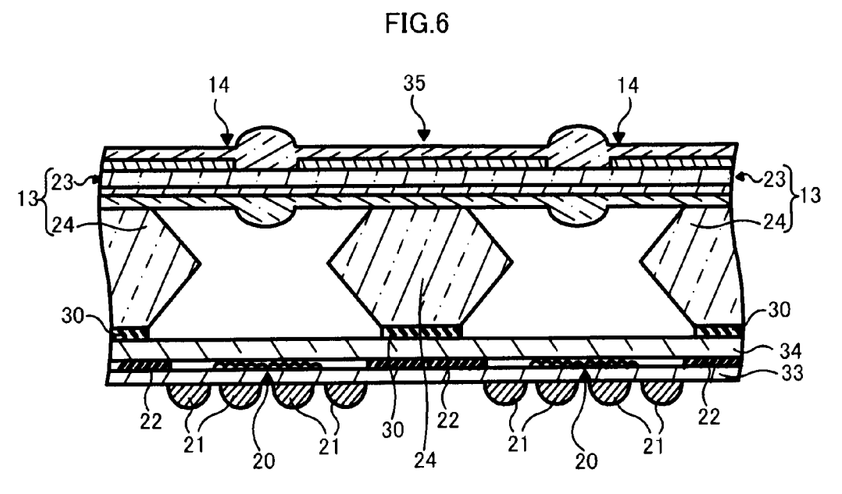
FIG. 6 is a sectional view for describing a process of forming the camera module body in the method for manufacturing the camera module according to the first embodiment.

Next, as illustrated in FIG. 6, on the top surface of the glass wafer 34 on the silicon wafer 33 which is made thinner, the WLO aggregate 35 is set and fixed through the second bonding adhesive 30. When the WLO aggregate 35 is set and fixed, the thickness of the second bonding adhesive 30 is adjusted such that the focus of each lens body 23 matches with each sensor unit 20.

According to this process, a plurality of camera module bodies 14 are formed in one silicon wafer 33.

Next, as illustrated in FIG. 7, the WLO aggregate 35, second bonding adhesive 30, glass wafer 34, first bonding adhesive 22 and silicon wafer 33 are diced along scribe lines. Dicing singulates a plurality of camera module bodies 14.

Figure 8:
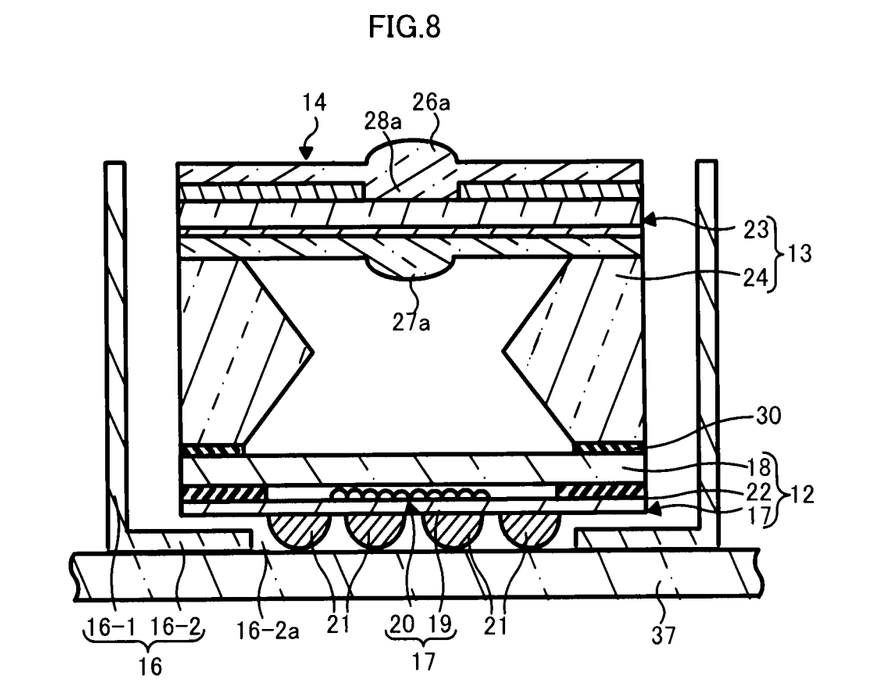
FIG. 8 is a sectional view for describing a process of arranging the camera module body in a first shield in the method for manufacturing the camera module according to the first embodiment.

Next, as illustrated in FIG. 8, the first shield 16 is set on a support body 37 which allows at least ultraviolet rays to transmit, and the camera module body 14 is arranged inside this first shield 16.

As the first shield 16 in which the camera module body 14 is arranged, the first shield 16 is employed which is formed in a size in which a gap is formed between the inner side surfaces of this shield 16 and the side surfaces of the camera module body 14. Thus, when the camera module body 14 is arranged in the first shield 16, the gap is formed between the side surfaces of the camera module body 14 and the cylindrical portion 16-1 of the first shield 16.

Further, as the first shield in which the camera module body 14 is arranged, the first shield 16 is employed in which the bottom portion 16-2 of the first shield 16 is formed thinner than the height of the external electrode 21. Thus, a desired gap is formed between the back surface of the camera module body 14 (the back surface of the silicon board 19) and the bottom portion 16-2 of the first shield 16.

In addition, this first shield 16 is employed, so that, even when there is a manufacturing error in a size of the camera module body 14, it is possible to easily arrange the camera module body 14 in the first shield 16.

Figure 9:
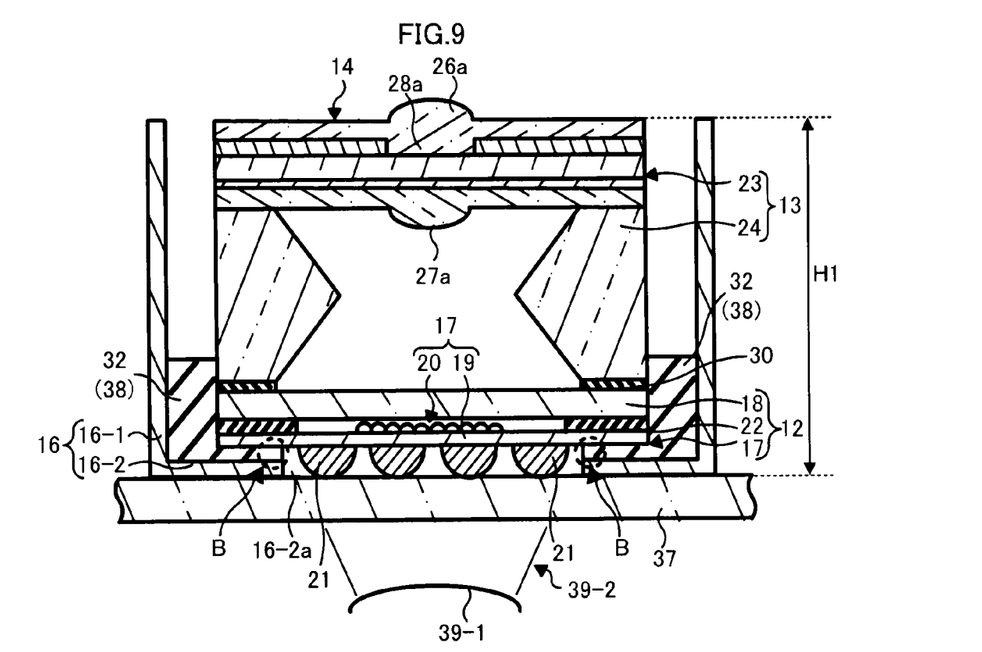
FIG. 9 is a sectional view for describing a process of forming a light shielding resin in the method for manufacturing the camera module according to the first embodiment.

Next, as illustrated in FIG. 9, the lower layer resin 32 is formed in the gap between the camera module body 14 and first shield 16. That is, the ultraviolet curable resin 38 which is made black is filled in the gap between the camera module body 14 and first shield 16 to an extent that, for example, the solid-state imaging apparatus 12 is entirely surrounded. Next, the filled ultraviolet curable resin 38 is radiated by an ultraviolet ray 39-2 from an ultraviolet ray light source 39-1 provided on the back surface of the support body 37. Radiation of the ultraviolet ray 39-2 instantly cures the ultraviolet curable resin 38, thereby forming the lower layer resin 32.

In this process, the ultraviolet curable resin is instantly cured to prevent the filled ultraviolet curable resin 38 from flowing out of the gap between the back surface of the silicon board 19 and the bottom portion 16-2 of the first shield 16.

Finally, the thermosetting resin is filled in the gap between the first shield 16 and camera module body 14 to fill the interior of the first shield 16. The height of the first shield 16 substantially matches with the first height H1 of the camera module body 14, and the thermosetting resin is filled only in the gap between the cylindrical portion 16-1 of the first shield 16 and side surfaces of the camera module body 14. The filled thermosetting resin is heated and cured to form the upper layer resin 31 as illustrated in FIGS. 1 and 2 and manufacture the camera module 11.

In the process of filling the thermosetting resin, the lower layer resin 32 is formed in advance in the gap between the back surface of the silicon board 19 and the bottom portion 16-2 of the first shield 16. Consequently, the thermosetting resin does not flow out of the gap between the back surface of the silicon board 19 and the bottom portion 16-2 of the first shield 16. Hence, the lower layer resin 32 only needs to be formed to fill at least the gap between the vicinity of the opening portion 16-2a of the bottom portion 16-2 of the first shield 16 (B in FIG. 2) and the back surface of the solid-state imaging apparatus 12. By forming the lower layer resin 32 in advance in at least a position of B in FIG. 10, the thermosetting resin is prevented from flowing out of the gap between the back surface of the silicon board 19 and the bottom portion 16-2 of the first shield 16.

As described above, with the method for manufacturing the camera module 11 and camera module according to the present embodiment, the ultraviolet curable resin 38 and thermosetting resin having the light shielding effect are poured and cured in the gap between the camera module body 14 and first shield 16 to form the light shielding resin 15. Consequently, a conventional lens holder does not need to be additionally formed, mold design and a mold upon processing of the lens holder are not necessary and the mold does not need to be managed. Further, the process of mounting the WLO 13 in the lens holder is not necessary. Consequently, it is possible to provide a camera module manufacturing method and a camera module which can reduce manufacturing cost.

Further, with the method for manufacturing the camera module 11 and the camera module 11 according to the present invention, not only the WLO 13 but also the entire side surfaces of the camera module body 14 are surrounded by the light shielding resin 15 and first shield 16, so that it is possible to provide the method for manufacturing the camera module 11 and the camera module 11 which provide a good effect of preventing light and electromagnetic waves from entering the inside of the camera module body 14.

(Second Embodiment)

Figure 10:
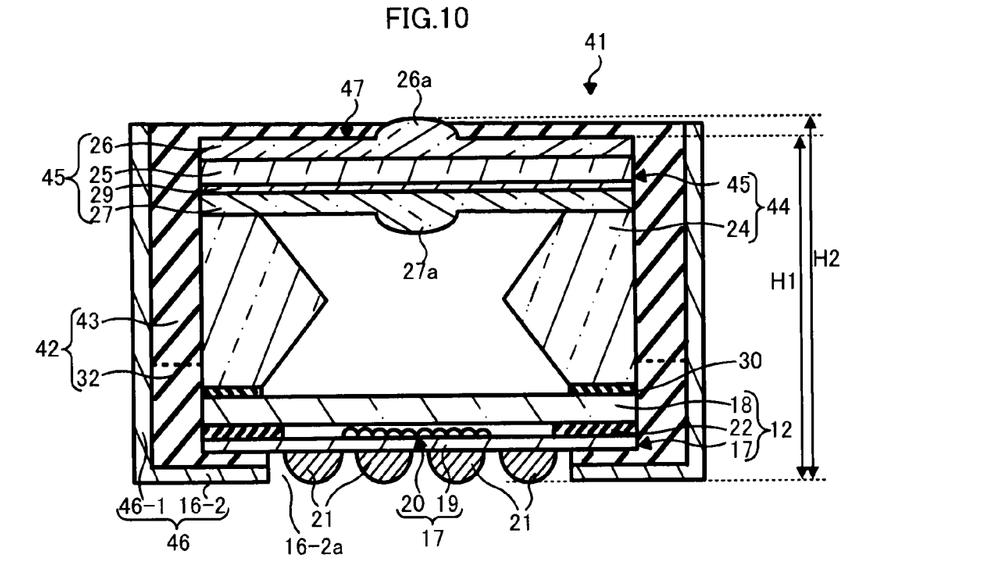
FIG. 10 is a sectional view illustrating a camera module according to a second embodiment, and corresponding to FIG. 2.

FIG. 10 is a sectional view illustrating a camera module according to a second embodiment, and corresponding to FIG. 2. A camera module 41 according to the second embodiment differs from the camera module 11 according to the first embodiment in an upper layer resin 43 forming a light shielding resin 42, a lens body 45 of a WLO 44 and a first shield 46. The upper resin 43, lens body 45 and first shield will be described. In addition, the other structures are the same as in the camera module 11 according to the first embodiment, and therefore will be assigned the same reference numerals and will not be described.

As illustrated in FIG. 10, with the camera module 41 according to the second embodiment, the upper resin layer 43 fills the gap between the side surfaces of the camera module body 47 and the cylindrical portion 46-1 of the first shield 46, and further is also formed on the upper surface of the camera module body 47. The upper resin 43 on the upper surface of the camera module body 47 is formed on the upper surface of the camera module body 47 except at least part of the lens unit 26a of the first lens layer 26. The upper layer resin 43 is also formed on the upper surface of the camera module body 47, thereby preventing light radiated on the portions other than the lens unit 26a among light radiated from above the camera module 41.

Further, the upper layer resin 43 is formed on the upper surface of the camera module body 47, so that the light shielding film 28 (FIG. 2) is not included in the lens body 45 of the WLO 44. That is, with the lens body 45, the first lens layer 26 is directly formed on the top surface of the lens board 25.

To form the upper layer resin 43 on the upper surface of the camera module body 47, the height of a first shield 46 is higher than a first height H1 of the camera module body 47, and is lower than a second height H2 of the camera module body 47 (a distance H2 between the top of the lens unit 26a of the first lens layer 26 and the lower ends of the external electrodes 21).

Next, the method for manufacturing the camera module 41 according to the second embodiment will be described. This manufacturing method includes the same processes up to formation of the lower layer resin 32 as the method for manufacturing the camera module 11 according to the first embodiment, and differs in the process of forming the upper layer resin 43. The method for manufacturing the camera module 41 according to the second embodiment will be described with reference to FIG. 11.

Figure 11:
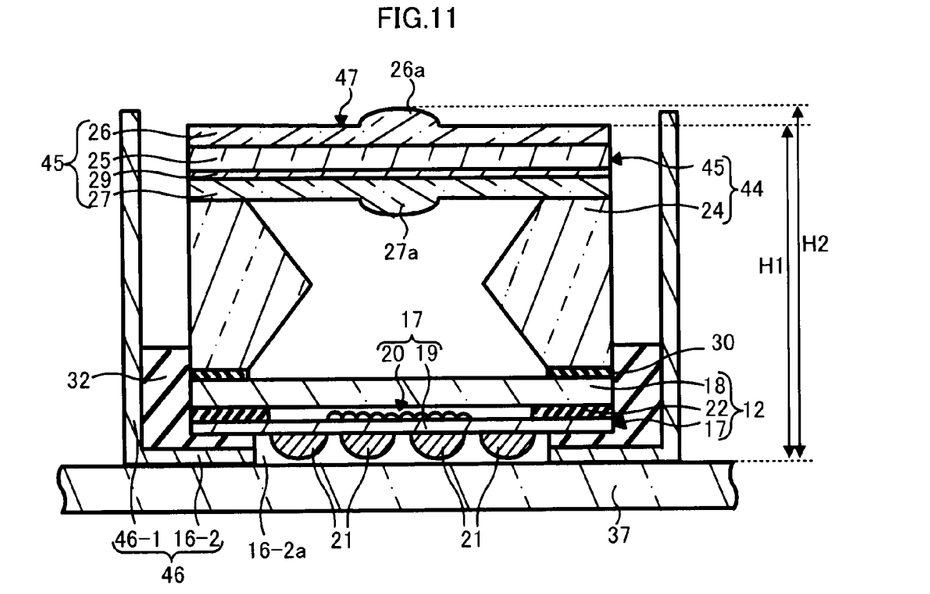
FIG. 11 is a sectional view for describing a process of forming a light shielding resin in a method for manufacturing the camera module according to the second embodiment.

FIG. 11 is a sectional view corresponding to FIG. 10 for describing a process of manufacturing the camera module 41 according to the present embodiment. After the lower layer resin 32 is formed as illustrated in FIG. 11, a thermosetting resin is filled in the gap between the first shield 46 and camera module body 47 and on the upper surface except the lens unit 26a of the camera module body 47 to fill the interior of the first shield 46. The height of the first shield 46 is higher than the first height H1 of the camera module body 47 and is lower than the second height H2, so that the thermosetting resin is filled in the gap between the cylindrical portion 46-1 of the first shield 46 and the side surfaces of the camera module body 47, and on the upper surface of the first lens layer 26 except the lens unit 26a. The filled thermosetting resin is heated and cured to form the upper layer resin 43 and manufacture the camera module 41 illustrated in FIG. 11.

As described above, even with the method for manufacturing the camera module 41 and the camera module 41 according to the present embodiment, the ultraviolet curable resin 31 and thermosetting resin having the light shielding effect are poured and cured in the gap between the camera module body 47 and first shield 46 to form the light shielding resin 42. Consequently, a conventional lens holder does not need to be additionally formed, mold design and a mold upon processing of the lens holder are not necessary and the mold does not need to be managed. Further, the process of mounting the WLO 44 in the lens holder is not necessary. Consequently, it is possible to provide a camera module manufacturing method and a camera module which can reduce manufacturing cost.

Further, with the method for manufacturing the camera module 41 and the camera module 41 according to the present invention, the entire side surfaces of the camera module body 47 are surrounded by the light shielding resin 42 and first shield 46, so that it is possible to provide the method for manufacturing the camera module 41 and the camera module 41 which provide a good effect of preventing light and electromagnetic waves from entering the inside of the camera module body 47.

Further, with the method for manufacturing the camera module 41 and the camera module 41 according to the present embodiment, the upper layer resin 43 covers the upper surface of the first lens layer 26 except the lens unit 26a, so that the light shielding film 28 does not need to be provided in the lens body 45. Consequently, the process of manufacturing the lens body 45 is simplified more than a conventional process, and manufacturing cost of the lens body 45 is reduced. Consequently, it is possible to provide a camera module manufacturing method and a camera module which can reduce manufacturing cost more.

(Third Embodiment)

Figure 12:
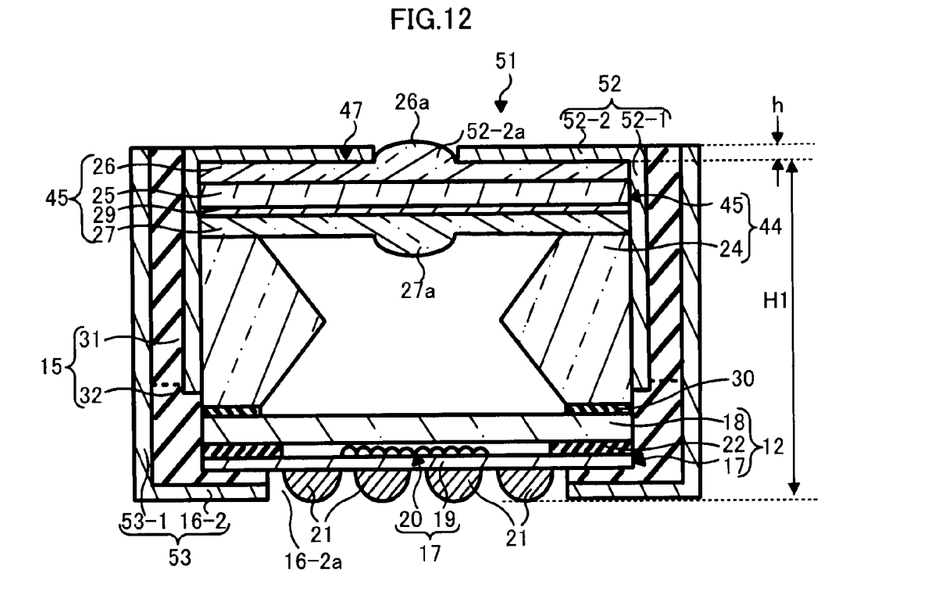
FIG. 12 is a sectional view illustrating a camera module according to a third embodiment, and corresponding to FIG. 2.

FIG. 12 is a sectional view illustrating a camera module according to a third embodiment, and corresponding to FIG. 2. A camera module 51 according to the third embodiment differs from the camera module 11 according to the first embodiment in including the second shield 52, and also differs in a first shield 53. The second shield 52 and first shield 53 will be described below. In addition, the other structures are the same as in the camera module 11 according to the first embodiment, and therefore will be assigned the same reference numerals and will not be described.

In addition, the lens body 45 of the WLO 44 in the camera module 51 according to the third embodiment and the camera module body 47 which has this WLO 44 employ the same configurations as the lens body 45 of the camera module 41 and the camera module body 47 according to the second embodiment, and therefore will be assigned the same reference numerals and will not be described.

As illustrated in FIG. 12, with the camera module 51 according to the third embodiment, the second shield 52 is formed with metal including a cylindrical portion 52-1 and a top panel 52-2. The second shield 52 is arranged such that the cylindrical portion 52-1 contacts the side surfaces of the WLO 44 and surrounds the side surfaces of the WLO 44, and the top panel 52-2 contacts the upper surface of the WLO 44 and covers the upper surface of the WLO 44. Further, an opening portion 52-2a is formed in the top panel 52-2 of the second shield 52, and the second shield 52 is arranged such that at least part of the lens unit 26a of the first lens layer 26 is exposed from the opening portion 52-2a of the top panel 52-2. In addition, the second shield has the light shielding effect. Consequently, light radiated on portions other than the lens unit 26a of the first lens layer 26 among light radiated from above the camera module 51 is shielded.

Further, the second shield 52 is arranged on the upper surface of the WLO 44, so that the light shielding film 28 is not included in the lens body 45 of the WLO 44.

Further, the second shield 52 is arranged on the upper surface of the WLO 44, and therefore the height of the first shield 53 is the height of the first height H1 of the camera module body 47 plus the thickness h of the top panel 52-2 of the second shield 52.

In addition, the upper layer resin 31 is formed between the camera module body 47 which has the second shield 52 and the first shield 53.

Figure 13:
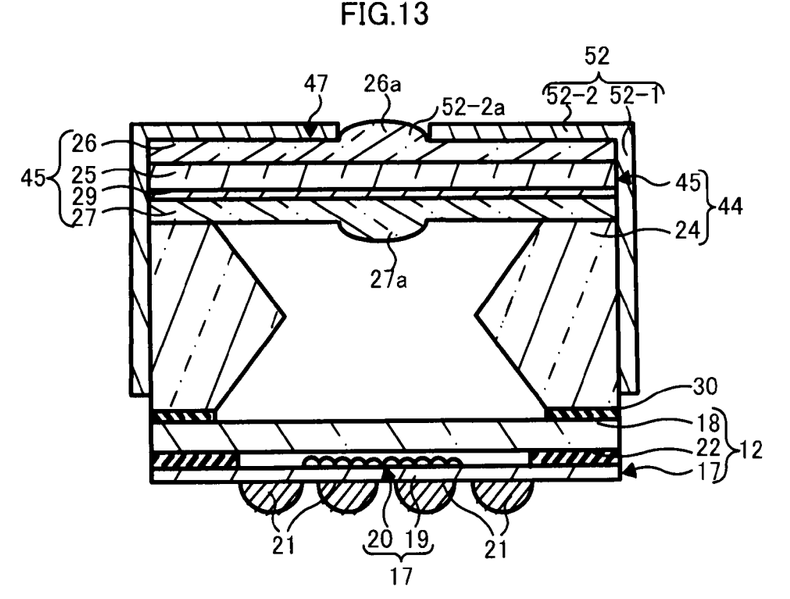
FIG. 13 is a sectional view for describing a process of arranging a second shield in a camera module body in a method for manufacturing the camera module according to the third embodiment.
Figure 14:
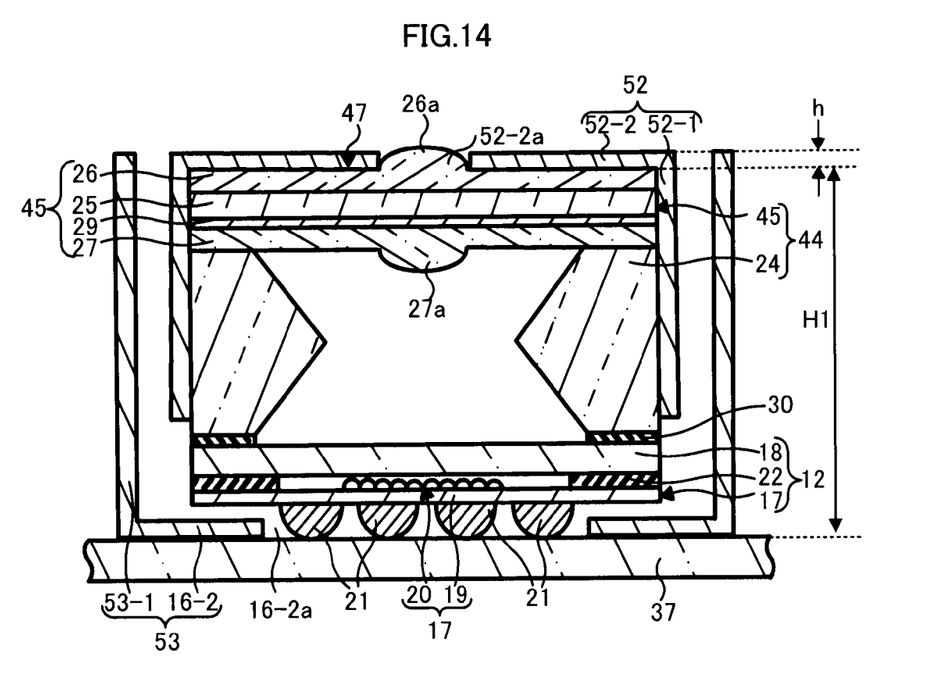
FIG. 14 is a sectional view for describing a process of arranging a first shield in a camera module body in the method for manufacturing the camera module according to the third embodiment.

Next, the method for manufacturing the camera module 51 according to the third embodiment will be described. This manufacturing method includes the same processes up to formation of the camera module body 47 as the method for manufacturing the camera module 11 according to the first embodiment. The method for manufacturing the camera module 51 according to the third embodiment will be described below with reference to FIGS. 13 and 14. FIGS. 13 and 14 are sectional views corresponding to FIG. 12 for describing a process of manufacturing the camera module 51 according to the present embodiment.

First, as illustrated in FIG. 13, the second shield 52 is arranged in the formed camera module body 47. The second shield 52 is arranged such that the second shield 52 contacts the WLO 44 and at least part of the lens unit 26a of the first lens layer 26 is exposed from the opening portion 52-2a of the top panel 52-2.

Next, as illustrated in FIG. 14, the camera module body 47 in which the second shield 52 is arranged is arranged in the first shield 53 such that the second shield 52 and the camera module body 47 do not contact the first shield 53.

Then, the light shielding resin 15 illustrated in FIG. 12 is formed in the gap between the camera module body 47 in which the second shield 52 is arranged and the first shield 53 in the same manner as the method for manufacturing the camera module 11 according to the first embodiment. The camera module 51 shown in FIG. 12 is manufactured by undergoing the above process.

The first shield 53 has the height of the first height H1 of the camera module body 47 plus the thickness h of the top panel 52-2 of the second shield 52. When the thermosetting resin is filled in the gap between the first shield 53 and camera module body 47 which has the second shield 52 to fill the interior of the first shield 53, the thermosetting resin is filled only in the gap between the side surfaces of the camera module 47 in which the second shield 52 is arranged and the first shield 53. That is, the upper layer resin 31 is formed between the camera module body 47 which has the second shield 52 and the first shield 53.

In addition, the second shield 52 may be arranged in the camera module body 47 after the camera module body 47 is arranged in the first shield 53.

As described above, even with the method for manufacturing the camera module 51 and camera module according to the present embodiment, the ultraviolet curable resin 38 and thermosetting resin having the light shielding effect are poured and cured in the gap between the camera module body 47 which has the second shield 52 and first shield 53 to form the light shielding resin 15. Consequently, a conventional lens holder does not need to be additionally formed, mold design and a mold upon processing of the lens holder are not necessary and the mold does not need to be managed. Further, the process of mounting the WLO 44 in the lens holder is not necessary. Consequently, it is possible to provide a camera module and a camera module manufacturing method which can reduce manufacturing cost.

Further, with the method for manufacturing the camera module 51 and the camera module 51 according to the present invention, the entire side surfaces of the camera module body 47 are surrounded by the light shielding resin 15 and first shield 53, so that it is possible to provide the method for manufacturing the camera module 51 and the camera module 51 which provide a good effect of preventing light and electromagnetic waves from entering the inside of the camera module body 47.

Further, with the method for manufacturing the camera module 51 and the camera module 51 according to the present embodiment, the second shield 52 covers the upper surface of the first lens layer 26 except the lens unit 26a, so that the light shielding film 28 does not need to be provided in the lens body 45. Consequently, the process of manufacturing the lens body 45 is simplified more than a conventional process, and manufacturing cost of the lens body 45 is reduced. Consequently, it is possible to provide a camera module manufacturing method and a camera module which can reduce manufacturing cost more.

Further, with the method for manufacturing the camera module 51 and the camera module 51 according to the present invention, most of the upper surface of the camera module body 47 is covered by the second shield 52, so that it is possible to provide the camera module 51 and the method for manufacturing the camera module 51 which can improve robustness against an external load.

In addition, with the method for manufacturing the camera module 51 and the camera module 51 according to the present embodiment, by, for example, making the first shield 53 and second shield 52 of the single metal, it is possible to provide an advantage of providing a uniform outlook.

(Fourth Embodiment)

Figure 15:
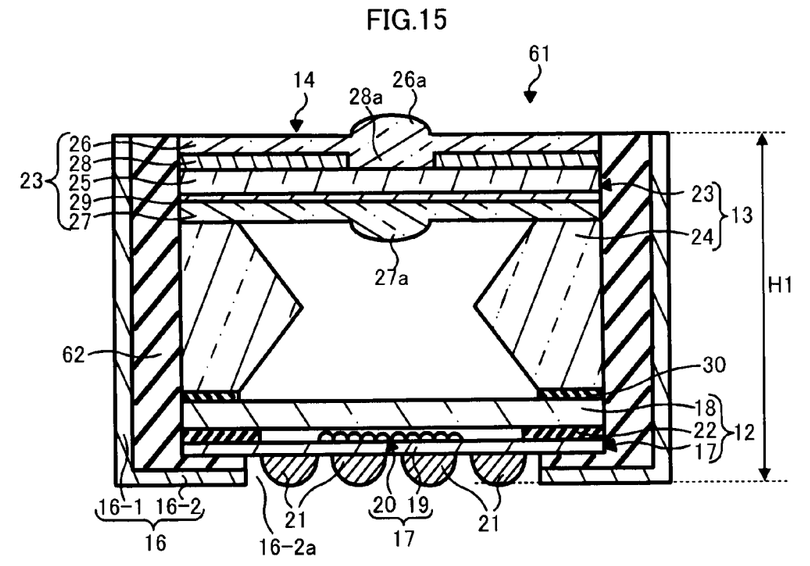
FIG. 15 is a sectional view illustrating a camera module according to a fourth embodiment, and corresponding to FIG. 2.

FIG. 15 is a sectional view illustrating a camera module according to a fourth embodiment, and corresponding to FIG. 2. A camera module 61 according to the fourth embodiment differs from the camera module 11 according to the first embodiment in a light shielding resin 62. The light shielding resin 62 will be described below. In addition, the other structures are the same as in the camera module 11 according to the first embodiment, and therefore will be assigned the same reference numerals and will not be described.

As illustrated in FIG. 15, with the camera module according to the fourth embodiment, the light shielding resin 62 is an ultraviolet curable resin which uses the thermosetting property resin in combination. This ultraviolet curable resin is made black by, for example, being added a black pigment such as carbon black. Consequently, similar to the light shielding resin 15 of the camera module 11 according to the first embodiment, the light shielding resin 62 prevents light radiated from the outside from being incident on the inside from the side surfaces and bottom surface of the camera module body 14, and functions as a bonding adhesive which bonds the camera module body 14 and first shield 16. In addition, the light shielding resin 62 may not be black, and only needs to have the light shielding effect. In this regard, the light shielding resin 62 is the same as the light shielding resin 15 of the camera module 11 according to the first embodiment.

Figure 16:
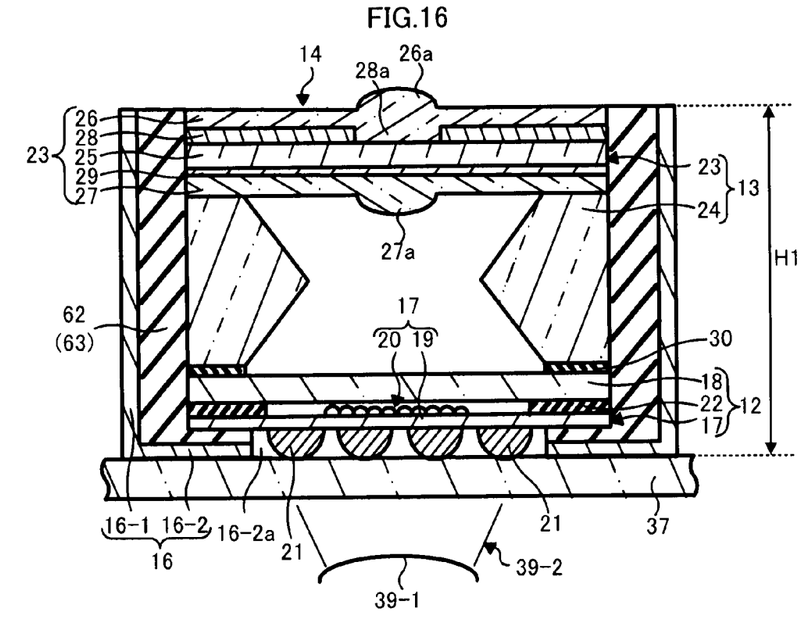
FIG. 16 is a sectional view for describing a process of forming a light shielding resin in a method for manufacturing the camera module according to the fourth embodiment.

The method for manufacturing the camera module 61 according to the fourth embodiment will be described below. This method for manufacturing the camera module 61 is entirely the same as the method for manufacturing the camera module 11 according to the first embodiment except the process of filling the light shielding resin 62 in the gap between the camera module body 14 and first shield 16. The process of filling the light shielding resin 62 will be described below with reference to FIG. 16. FIG. 16 is a sectional view corresponding to FIG. 15 for describing the method for manufacturing the camera module 61 according to the fourth embodiment.

As illustrated in FIG. 16, after the camera module body 14 is arranged in the first shield 16, the ultraviolet curable resin 63 which uses the thermosetting resin in combination is filled in the gap between the camera module body 14 and the first shield 16 to fill the interior of the first shield 16.

After the ultraviolet curable resin 63 which uses the thermosetting resin in combination is filled in the first shield 16, the ultraviolet curable resin 63 is cured by radiating the ultraviolet ray 39-2 emitted from the ultraviolet ray light source 39-1 on this ultraviolet curable resin 63, from the back surface of the support body 37. The ultraviolet curable resin 63 only needs to be cured to an extent that the ultraviolet curable resin 63 does not flow out of at least the gap between the back surface of the silicon board 19 and the bottom portion 16-2 of the first shield 16.

After the ultraviolet ray 39 is radiated on the ultraviolet curable resin 63 which uses the thermosetting resin in combination, this ultraviolet curable resin 63 is heated and is further cured rigidly to form the light shielding resin 62. The camera module 61 shown in FIG. 15 is manufactured by undergoing the above process.

As described above, with the method for manufacturing the camera module 61 and the camera module 61 according to the present embodiment, the ultraviolet curable resin 63 which has the light shielding effect and uses the thermosetting property resin in combination is poured and cured in the gap between the camera module body 14 and first shield 16 to form the light shielding resin 62. Consequently, a conventional lens holder does not need to be additionally formed, mold design and a mold upon processing of the lens holder are not necessary and the mold does not need to be managed. Further, the process of mounting the WLO 13 in the lens holder is not necessary. Consequently, it is possible to provide a camera module manufacturing method and a camera module which can reduce manufacturing cost.

Further, with the method for manufacturing the camera module 61 and the camera module 61 according to the present invention, the entire side surfaces of the camera module body 14 are surrounded by the light shielding resin 62 and first shield 16, so that it is possible to provide the method for manufacturing the camera module 61 and the camera module 61 which provide a good effect of preventing light and electromagnetic waves from entering the inside of the camera module body 14.

Further, with the method for manufacturing the camera module 61 and the camera module 61 according to the present embodiment, the light shielding resin 62 is formed using only the ultraviolet curable resin 63 which uses one type of the thermosetting resin in combination. Consequently, the process of forming the light shielding resin 62 becomes easier, so that it is possible to more easily manufacture the camera module 61. Consequently, it is possible to provide a method for manufacturing the camera module 61 and the camera module 61 which can reduce manufacturing cost more.

In addition, even when this camera module manufacturing method according to the fourth embodiment is applied to the camera module manufacturing methods according to the second and third embodiments, it is possible to provide the camera module manufacturing method and the camera module which can reduce manufacturing cost for the same reason as in the second and third embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, the light shielding resin 15, 42 and 62 may have the degree of viscosity which does not allow the resin to be poured in the gap between the back surface of the silicon board 19 and the first shields 16, 46 and 53 does not flow out of the gap between the back surface of the silicon board 19 and the first shields 16, 46 and 53 before curing.

Further, the resin to be poured in the gap between the back surface of the silicon board 19 and the first shields 16, 46 and 53 only needs to have the light shielding effect without flowing out of the gap between the back surface of the silicon board 19 and the first shields 16, 46 and 53, and may be, for example, an air-setting resin or anaerobic setting resin.

Further, with the present invention, the structures of the camera module bodies 14 and 47 are by no means limited to the above embodiments. Consequently, the WLO 13 having the light shielding film 28 may be applied to, for example, the camera modules 41 and 51 according to the second and third embodiments. By adopting the WLO 13 having the light shielding effect 28, the light shielding capability of the camera modules 41 and 51 according to the second and third embodiments further improve.

What is claimed is:
1. A method for manufacturing a camera module comprising:
arranging a camera module body which comprises a sensor board having a sensor unit and an optical element having a lens unit and a spacer, in a first shield such that a gap is formed between the camera module body and the first shield; and forming a resin comprising a light shielding effect in the gap between the first shield and the camera module body, wherein the resin comprising the light shielding effect comprises an upper layer resin and a lower layer resin;

wherein forming the resin comprising the light shielding effect and formed with the upper layer resin and the lower layer resin comprises:

filling an ultraviolet curable resin in at least a gap between a back surface of the camera module body and the first shield;

radiating ultraviolet ray on the ultraviolet curable resin, curing the ultraviolet curable resin and forming the lower layer resin;

filling a thermosetting resin to fill an interior of the first shield after the forming of the lower layer resin; and heating the thermosetting resin, curing the thermosetting resin and forming the upper layer resin.

2. The method for manufacturing the camera module according to claim 1, wherein forming the resin comprising the light shielding effect is forming a resin which is made black.

3. The method for manufacturing the camera module according to claim 1, further comprising forming an external electrode which is electrically connected with the sensor unit, in a back surface of the sensor board, wherein arranging the camera module body in the first shield comprises arranging the camera module body such that the external electrode is exposed from an opening portion formed in a bottom portion of the first shield formed with the bottom portion and a cylindrical portion, and the side surface and the back surface of the camera module body are separated from the first shield.

4. The method for manufacturing the camera module according to claim 1, wherein the camera module body is formed on a wafer in which a plurality of sensor units are formed, by setting an aggregate of an optical element formed with a plurality of optical elements and cutting the aggregate of the wafer and the optical element.

5. A method for manufacturing a camera module comprising:

arranging a camera module body which comprises a sensor board having a sensor unit and an optical element having a lens unit and a spacer, in a first shield such that a gap is formed between the camera module body and the first shield; and forming a resin comprising a light shielding effect in the gap between the first shield and the camera module body, wherein forming the resin comprising the light shielding effect is forming a resin comprising a light shielding effect, in a gap between the first shield and the camera module body and in an upper surface of the camera module body except at least part of a lens unit of the camera module body, the resin comprising the light shielding effect is formed with an upper layer resin and a lower layer resin; and forming the resin comprising the light shielding effect and formed with the upper layer resin and the lower layer resin comprises:

filling an ultraviolet curable resin in at least a gap between a back surface of the camera module body and the first shield;

radiating ultraviolet ray on the ultraviolet curable resin, curing the ultraviolet curable resin and forming the lower layer resin;

filling a thermosetting resin in a gap between the first shield and the camera module body and in an upper surface of the camera module body except at least part of a lens unit of the camera module body after the forming of the lower layer resin; and heating the thermosetting resin, curing the thermosetting resin and forming the upper layer resin.

6. The method for manufacturing the camera module according to claim 5, wherein forming the resin comprising the light shielding effect is forming a resin which is made black.

7. The method for manufacturing the camera module according to claim 5, further comprising forming an external electrode which is electrically connected with the sensor unit, in a back surface of the sensor board, wherein arranging the camera module body in the first shield comprises arranging the camera module body such that the external electrode is exposed from an opening portion formed in a bottom portion of the first shield formed with the bottom portion and a cylindrical portion, and the side surface and the back surface of the camera module body are separated from the first shield.

8. The method for manufacturing the camera module according to claim 5, wherein the camera module body is formed on a wafer in which a plurality of sensor units are formed, by setting an aggregate of an optical element formed with a plurality of optical elements and cutting the aggregate of the wafer and the optical element.

9. A method for manufacturing a camera module comprising:

arranging a camera module body which comprises a sensor board having a sensor unit and an optical element having a lens unit and a spacer, in a first shield such that a gap is formed between the camera module body and the first shield; and forming a resin comprising a light shielding effect in the gap between the first shield and the camera module body, wherein arranging the camera module body in the first shield comprises forming a second shield to cover a side surface of the camera module body and an upper surface of the camera module body except at least part of a lens unit of the camera module body, and comprises arranging the camera module body which comprises the second shield in the first shield such that a gap is formed between the camera module body and the first shield, the resin comprising the light shielding effect comprises an upper layer resin and a lower layer resin; and forming the resin comprising the light shielding effect and formed with the upper layer resin and the lower layer resin comprises:

filling an ultraviolet curable resin in at least a gap between a back surface of the camera module body comprising the second shield, and the first shield;

radiating ultraviolet ray on the ultraviolet curable resin, curing the ultraviolet curable resin and forming the lower layer resin;

filling a thermosetting resin to fill an interior of the first shield after the forming of the lower layer resin; and heating the thermosetting resin, curing the thermosetting resin and forming the upper layer resin.

10. The method for manufacturing the camera module according to claim 9, wherein forming the resin comprising the light shielding effect is forming a resin which is made black.

11. The method for manufacturing the camera module according to claim 9, further comprising forming an external electrode which is electrically connected with the sensor unit, in a back surface of the sensor board, wherein arranging the camera module body in the first shield comprises arranging the camera module body such that the external electrode is exposed from an opening portion formed in a bottom portion of the first shield formed with the bottom portion and a cylindrical portion, and the side surface and the back surface of the camera module body are separated from the first shield.

12. The method for manufacturing the camera module according to claim 9, wherein the camera module body is formed on a wafer in which a plurality of sensor units are formed, by setting an aggregate of an optical element formed with a plurality of optical elements and cutting the aggregate of the wafer and the optical element.

13. A camera module comprising:
a sensor board having a sensor unit;
an optical element which is set on the sensor board and has a lens unit and a spacer;
a first shield which is arranged such that a gap is formed between the first shield and a camera module body which comprises the optical element and the sensor board; and
a resin which is formed in a gap between the first shield and the camera module body and which comprises a light shielding effect,
wherein the resin comprising the light shielding effect comprises:
a lower layer resin which is formed in at least a gap between a back surface of the camera module body and the first shield and which is made of an ultraviolet curable resin; and
an upper layer resin which is formed between a side surface of the camera module body and the first shield and which is made of a thermosetting resin.

14. The camera module according to claim 13, wherein the resin comprising the light shielding effect is a resin which is made black.

15. The camera module according to claim 13, wherein:
the sensor board further comprises an external electrode which is electrically connected with the sensor unit, in a back surface of the sensor board;
a bottom portion of the first shield formed with the bottom portion and a cylindrical portion further comprises an opening portion which exposes the external electrode; and
the first shield formed with the bottom portion comprising the opening portion and the cylindrical portion is arranged such that a gap is formed between the first shield and a side surface and a back surface of the camera module body.

16. A camera module comprising:
a sensor board having a sensor unit;
an optical element which is set on the sensor board and has a lens unit and a spacer;
a first shield which is arranged such that a gap is formed between the first shield and a camera module body which comprises the optical element and the sensor board; and
a resin which is formed in a gap between the first shield and the camera module body and which comprises a light shielding effect,
wherein the resin comprising the light shielding effect is formed in a gap between the first shield and the camera module body and in an upper surface of the camera module body except at least part of a lens unit of the camera module body,
wherein the resin comprising the light shielding effect comprises:
a lower layer resin which is formed in at least a gap between a back surface of the camera module body and the first shield and which is made of an ultraviolet curable resin; and
an upper layer resin which is formed between a side surface of the camera module body and the first shield and is formed on an upper surface of the camera module body except at least part of the lens unit of the camera module body, and which is made of a thermosetting resin.

17. The camera module according to claim 16, wherein the resin comprising the light shielding effect is a resin which is made black.

18. The camera module according to claim 16, wherein:
the sensor board further comprises an external electrode which is electrically connected with the sensor unit, in a back surface of the sensor board;
a bottom portion of the first shield formed with the bottom portion and a cylindrical portion further comprises an opening portion which exposes the external electrode; and
the first shield formed with the bottom portion comprising the opening portion and the cylindrical portion is arranged such that a gap is formed between the first shield and a side surface and a back surface of the camera module body.

19. A camera module comprising:
a sensor board having a sensor unit;
an optical element which is set on the sensor board and has a lens unit and a spacer;
a first shield which is arranged such that a gap is formed between the first shield and a camera module body which comprises the optical element and the sensor board; and
a resin which is formed in a gap between the first shield and the camera module body and which comprises a light shielding effect,
the camera module body is covered by a second shield which covers the side surface of the camera module body and an upper surface of the camera module body except at least part of the lens unit of the camera module body; and
the first shield is arranged such that a gap is formed between the first shield and the camera module body which is covered by the second shield,
wherein the resin comprising the light shielding effect comprises:
a lower layer resin which is formed in at least a gap between a back surface of the camera module body covered by the second shield and the first shield, and which is made of an ultraviolet curable resin; and
an upper layer resin which is formed between a side surface of the camera module body covered by the second shield and the first shield, and which is made of a thermosetting resin.

20. The camera module according to claim 19, wherein the resin comprising the light shielding effect is a resin which is made black.

21. The camera module according to claim 19, wherein:
the sensor board further comprises an external electrode which is electrically connected with the sensor unit, in a back surface of the sensor board;

a bottom portion of the first shield formed with the bottom portion and a cylindrical portion further comprises an opening portion which exposes the external electrode; and the first shield formed with the bottom portion comprising the opening portion and the cylindrical portion is arranged such that a gap is formed between the first shield and a side surface and a back surface of the camera module body.

* * * * *